United States Patent
Satou

(10) Patent No.: US 7,537,667 B2
(45) Date of Patent: May 26, 2009

(54) METHOD OF PROCESSING COMPOSITE GREEN SHEET

(75) Inventor: Hisashi Satou, Kirishima (JP)

(73) Assignee: Kyocera Corporation, Kyoto (JP)

( * ) Notice: Subject to any disclaimer, the term of this patent is extended or adjusted under 35 U.S.C. 154(b) by 372 days.

(21) Appl. No.: 11/361,678

(22) Filed: Feb. 24, 2006

(65) Prior Publication Data

US 2006/0196599 A1 Sep. 7, 2006

(30) Foreign Application Priority Data

Feb. 25, 2005 (JP) .............................. 2005-050745

(51) Int. Cl.
| | | |
|---|---|---|
| B32B 37/14 | (2006.01) | |
| B32B 38/04 | (2006.01) | |
| B32B 38/10 | (2006.01) | |
| B32B 38/08 | (2006.01) | |
| B32B 37/26 | (2006.01) | |
| B32B 37/06 | (2006.01) | |
| B32B 37/04 | (2006.01) | |
| B32B 38/18 | (2006.01) | |

(52) U.S. Cl. .................... 156/253; 156/252; 156/272.8; 156/273.3; 156/281; 156/289; 83/22; 83/24; 83/30

(58) Field of Classification Search .............. 156/252, 156/253, 272.8, 272.2, 273.3, 281, 289; 83/22, 24, 30

See application file for complete search history.

(56) References Cited

U.S. PATENT DOCUMENTS

| | | | | |
|---|---|---|---|---|
| 3,742,182 A | * | 6/1973 | Saunders ............... | 219/121.71 |
| 5,274,916 A | * | 1/1994 | Kawabata et al. ............. | 29/848 |
| 5,293,025 A | * | 3/1994 | Wang .................... | 219/121.71 |
| 5,294,567 A | * | 3/1994 | Dorfman et al. ........ | 219/121.69 |
| 5,757,331 A | * | 5/1998 | Yoneyama et al. .......... | 343/783 |
| 6,359,255 B1 | * | 3/2002 | Yamamoto et al. ..... | 219/121.71 |
| 6,413,340 B1 | * | 7/2002 | Anbo et al. ............... | 156/89.12 |
| 6,795,295 B2 | * | 9/2004 | Murakami et al. ........ | 361/306.3 |
| 6,800,237 B1 | * | 10/2004 | Yamamoto et al. .......... | 264/400 |
| 2008/0041832 A1 | * | 2/2008 | Sykes et al. ............ | 219/121.84 |

FOREIGN PATENT DOCUMENTS

| | | | | |
|---|---|---|---|---|
| JP | 2001-148570 | | * | 5/2001 |
| JP | 2001148570 A | | * | 5/2001 |
| JP | 2002-110442 | | * | 4/2002 |
| JP | 2002110442 A | | * | 4/2002 |
| JP | 2002-178180 | | * | 6/2002 |
| JP | 2002178180 A | | * | 6/2002 |

(Continued)

Primary Examiner—Philip C Tucker
Assistant Examiner—Sonya Mazumdar
(74) Attorney, Agent, or Firm—Hogan & Hartson LLP

(57) ABSTRACT

A composite green sheet which comprises a green sheet including an inorganic powder and an organic binder, and a conductive layer formed thereon is prepared; the composite green sheet is then placed on a supporting surface of a base member containing a liquid; and the composite green sheet is irradiated with a laser light so as to form a through hole according to need, and thereby to evaporate the liquid contained in the base member so that waste remaining on the inner wall surface of the through hole is cleaned and removed. As a result, the conductive layer is exposed at the inner wall of the through hole penetrating the conductive layer.

28 Claims, 5 Drawing Sheets

FOREIGN PATENT DOCUMENTS

| | | | |
|---|---|---|---|
| JP | 2002-299793 | * | 10/2002 |
| JP | 2002299793 A | * | 10/2002 |
| JP | 2003-211277 | * | 7/2003 |
| JP | 2003211277 A | * | 7/2003 |
| JP | 2003-340818 | | 12/2003 |
| JP | 2004-42082 | * | 2/2004 |
| JP | 2004042082 A | * | 2/2004 |
| JP | 2004-158571 | * | 6/2004 |
| JP | 2004158571 A | * | 6/2004 |
| JP | 2004-311990 | * | 11/2004 |
| JP | 2004311990 A | * | 11/2004 |
| JP | 2004-363353 | * | 12/2004 |
| JP | 2004363353 A | * | 12/2004 |
| JP | 2005-39071 | * | 2/2005 |
| JP | 2005039071 A | * | 2/2005 |
| SU | 1757826 | * | 8/1992 |
| SU | 1757826 A1 | * | 8/1992 |

* cited by examiner

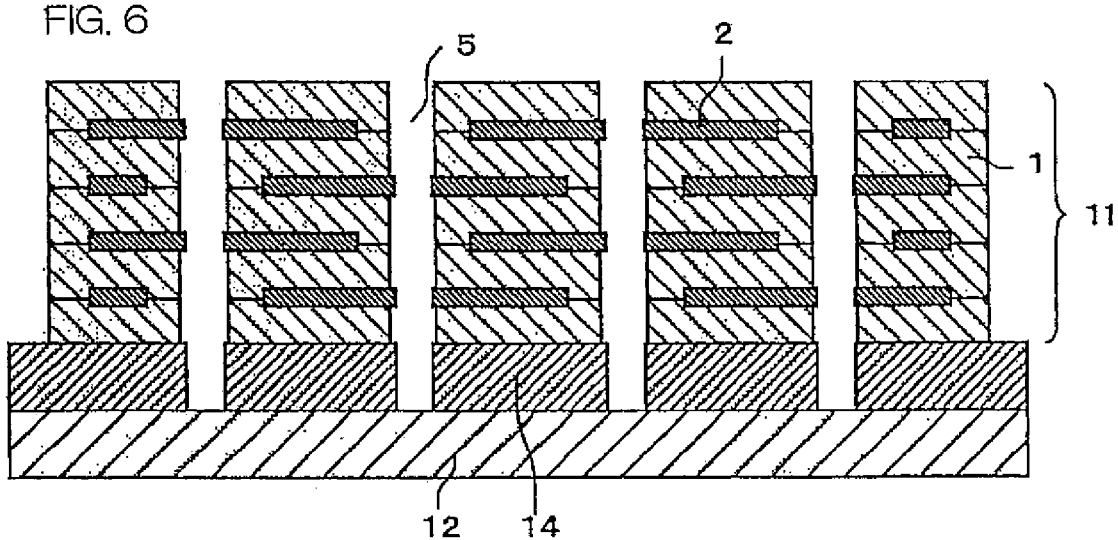
FIG. 6
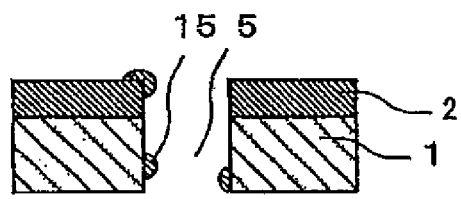
FIG. 7
PRIOR ART
FIG. 8(a)
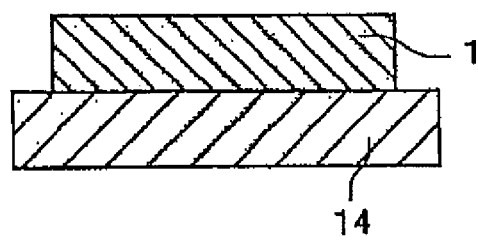
PRIOR ART
FIG. 8(b)
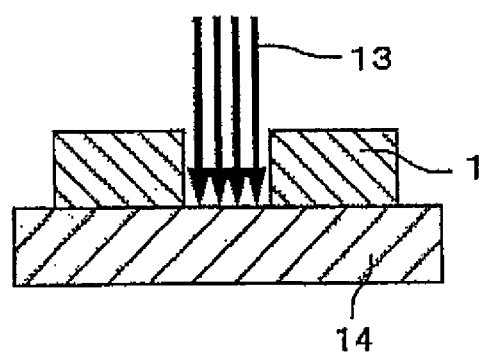

METHOD OF PROCESSING COMPOSITE GREEN SHEET

BACKGROUND OF THE INVENTION

1. Field of the Invention

The present invention relates to a method of forming a thorough hole in a composite green sheet provided with a conductive layer formed therein and/or a processing method for further processing the through hole that has been formed.

2. Description of Related Art

Processes of producing a multilayer electronic component include the following process: firstly, a green sheet including an inorganic powder and an organic binder is formed, and then a conductive layer is formed on the green sheet by screen printing or the like to form a composite green sheet, which is followed by forming a through hole in the foregoing composite green sheet, in which at least a part of the through hole penetrates the conductive layer so that the conductive layer is exposed at the inner wall of the through hole. Subsequently, the through hole is filled or applied with a through hole conductor.

A plurality of the composite green sheets processed in the foregoing way are laminated together to form a multilayer body.

The through holes formed in the multilayer body are filled or applied with through hole conductors so as to constitute conduction paths and exterior electrodes. Processes used for forming a through hole in the composite green sheet include, namely, laser irradiation, punching with use of metal dies, microdrilling and the like. However, when the through hole is formed by laser irradiation, the organic binder and inorganic powder in the composite green sheet, and substances thereof that are denatured by the laser irradiation remain as waste on the surface of the inner wall and edges of the through hole. Also, in the cases of microdrilling and punching with use of metal dies, chippings of the green sheet and crumbled portions of the inner wall surface remain as waste. In any case, chippings resulting from processing the composite green sheet remain as waste on the inner wall surface and edges. When the through hole is filled with a conductive paste in this condition, filling with the conductive paste is impeded to cause defective filling, the conductive layer fails to be exposed to the inside of the through hole due to the waste, resulting in the conductive layer failing to be connected to the through hole conductor, or waste portions become detached after the filling with the conductive paste, resulting in the presence of foreign substances inside the through hole. For this reason, products that are out-of-spec in size due to irregular-shaped through holes, and problems in electrical continuity are caused.

In order to solve these problems, there has been proposed a method as shown in FIGS. 8(a), 8(b) in which a green sheet 1 is disposed on a base member 20 comprising a solid resin material such as PET (polyethylene terephthalate), PEN (polyethylene naphtahalate) or the like, and is irradiated with a laser light from the surface side of the green sheet so as to form a through hole 5 so that the laser light reaches and irradiates the base member 20 comprising PET or PEN, causing components of the base member 20 to evaporate. Waste inside the through hole is removed by the evaporation pressure. (Refer to Japanese Unexamined Patent Publication No. 2003-340818, for example.)

However, the conventional method of forming a through hole in a green sheet shown in FIGS. 8(a), 8(b) has a problem in that the amount of gas generated by evaporation of the separation film comprising PET, PEN or the like during the laser light irradiation is so small that the evaporation pressure is inadequate for removal of waste inside the through hole. In addition, there are cases where the components of PET or PEN or those denatured by the laser light remain in the through hole as waste. As described so far, waste remains in the through hole also in the method of prior art, which, as in the previous case, fails to completely preclude the problems such as defective filling during the through hole filling process, mixing of foreign substances due to the waste portions becoming detached afterward, and products that are out-of-spec in size due to irregular-shaped through holes. In particular, when a conductive layer is formed in a composite green sheet so that the conductive layer is exposed at the inner wall of the through hole, if waste of the green sheet and waste of the components of PET or PEN or waste of those that are denatured by the laser light remain in the conductive layer at the inner wall region and impede exposure of the conductive layer, the through hole conductor that fills or is applied to the through hole cannot be connected to the conductor layer.

The present invention has been devised with the foregoing problems in view, and accordingly an object thereof is to provide a method of processing a composite green sheet capable of more reliably exposing a conductive layer at the inner wall surface of a through hole by reducing waste that can remain on the inner wall surface of the through hole.

SUMMARY OF THE INVENTION

A method of processing a composite green sheet according to the present invention comprises: a process A of preparing a composite sheet including a conductive layer and a green sheet; a process B of placing a surface of the composite sheet on a base member containing a liquid; and a process C of irradiating another surface of the composite sheet with a laser light to form a through hole penetrating the composite sheet and to evaporate the liquid.

The processing method further includes a process D of detaching the composite green sheet having the through hole formed therein from the base member.

A method of processing a composite green sheet according to the present invention comprises: a process E of preparing a composite sheet including a conductive layer and a green sheet; a process F of forming a through hole in a predetermined region of the composite green sheet; a process G of placing the composite green sheet on a base member containing a liquid; and a process H of irradiating a region of the base member corresponding the through hole with a laser light so as to evaporate the liquid.

The processing method further includes a process I of detaching the composite green sheet with the though hole having been cleaned from the base member.

The method of processing a composite green sheet according to the present invention is also characterized in that the composite green sheet comprises a plurality of layers of the green sheet and the conductive layer laminated together.

The method of processing a composite green sheet according to the present invention is also characterized in that the green sheet includes an inorganic powder and a first organic binder that is soluble in the liquid.

The method of processing a composite green sheet according to the present invention is also characterized in that the conductive layer includes a conductive powder and a second organic binder that is soluble in the liquid.

Furthermore, the method of processing a composite green sheet according to the present invention is characterized in that the liquid comprises water.

The method of processing a composite green sheet according to the present invention is also characterized in that the liquid comprises a low-molecular-weight organic material having a molecular weight on the order of 400 or less.

The method of processing a composite green sheet according to the present invention is also characterized in that the liquid includes at least one kind selected from the group consisting of phthalate esters including dibutyl phthalate, adipate esters, and hydro chloro fluoro carbon (HCFC).

The method of processing a composite green sheet according to the present-invention is also characterized in that the solubility of the second organic binder in the liquid at 25° C. is lower than the solubility of the first organic binder in the liquid at 25° C.

The method of processing a composite green sheet according to the present invention is also characterized in that the solubility of the first organic binder in the liquid at 25° C. is 0.1-10%.

The method of processing a composite green sheet according to the present invention is also characterized in that the solubility of the second organic binder in the liquid at 25° C. is 1% or less excluding 0%.

The method of processing a composite green sheet according to the present invention is also characterized in that the base member comprises a porous or fibrous material and includes the liquid impregnated therein.

The method of processing a composite green sheet according to the present invention is also characterized in that a separation film is interposed between the base member and the green sheet.

According to a method of processing a composite green sheet of the present invention, a composite green sheet comprising a conductive layer and a green sheet is placed on a base member including a liquid, a predetermined position of the composite green sheet is irradiated with a laser light from a surface side (the side opposite to the base member side) of the composite green sheet so as to form a through hole in the composite green sheet, thereby allowing the laser light to reach the base member. By the thermal energy of the laser light that has reached the base member, a great amount of the liquid included in the base member is evaporated instantaneously, generating a vapor of high temperature and high pressure. At the same time, a vapor flow directed to the opening part of the through hole is generated inside the through hole by the generated vapor. When waste adhering to the inner wall and edges of the through hole comes in contact with the vapor of high temperature and high pressure, it becomes easy to peel off, and is discharged to the outside by the air flow generated inside the though hole. The waste adhering to the inner wall and edges of the through hole is thus removed, allowing the conductive layer to be reliably exposed at the inner wall of the through hole.

Also, the method of processing a composite green sheet of the present invention may be arranged such that a composite green sheet is preliminarily provided with a through hole formed therein, then the composite green sheet is placed on a base member, and a region of the base member corresponding to the through hole is irradiated with a laser light. By carrying out the formation of the through hole and removal of waste on the inner wall surface of the through hole separately as described above, the amount of energy of the laser light for evaporating the liquid is not affected by the amount of energy for boring a through hole in the composite green sheet, so that the liquid can be evaporated by a stable amount of energy. Accordingly, a regular-shaped through hole can be obtained.

Meanwhile, according to the method of processing a composite green sheet of the present invention, a great amount of liquid is instantaneously evaporated by laser light. Accordingly, as compared with the conventional method in which components of a resin film material are volatized to remove waste, the present invention is capable of generating a gas of high temperature and high pressure inside the through hole, the waste in the through hole is therefore reliably removed.

In addition, according to the method of processing a composite green sheet of the present invention, since the green sheet includes an inorganic powder and a first organic binder soluble in the liquid, waste adhering to the inner wall surface and edges of the through hole can be removed with more reliability. This is because when a part of gas generated inside the through hole collides with the waste, it is condensed to return to the liquid, which dissolves the part of the first organic binder included in the waste. Not only the first organic binder included in the waste, but also the first organic binder included in the green sheet exposed at the inner wall surface of the through hole are dissolved in the condensed liquid, thereby reducing the inner wall surface of the through hole, so that the effect of removing the waste is enhanced.

Moreover, according to a method of processing a composite green sheet of the present invention, since the conductive layer includes conductive particles and a second organic binder soluble in the liquid, waste adhering to the inner wall and edges of the through hole can be removed with more reliability. This is because, as previously described referring to the first organic binder, when a part of gas generated inside the through hole collides with the waste, it is condensed to return to the liquid, which dissolves the part of the second organic binder included in the waste.

Furthermore, according to a method of processing a composite green sheet of the present invention, water is used as the liquid. This greatly facilitates the handling and eliminates the possibility of ignition or the like as compared with cases where an organic component is used for the liquid. Accordingly, there is no need to provide limitations in the processing conditions in order to prevent accidents such as ignition, which extends the range of choice of processing conditions. For example, since energy of the laser light can be increased, evaporated liquid can come in contact with the inner wall surface of the through hole with great force, the effect to blow off the waste becomes greater, enhancing the removing effect.

Also, according to a method of processing a composite green sheet of the present invention, by employing a liquid comprising an organic material having a molecular weight of 400 or less as the liquid, a great amount of vapor can be evaporated by a small amount of energy of laser light, the effect of cleaning is enhanced.

According to a method of processing a composite green sheet of the present invention, since the liquid comprises at least one kind selected from the group consisting of phthalate esters including dibutyl phthalate, adipate esters, and hydro chloro fluoro carbon (HCFC), there is little possibility of danger of ignition of the liquid during the irradiation of the laser light, no particular measures are necessary for ignition prevention.

According to a method of processing a composite green sheet of the present invention, a first organic binder included in the green sheet at the inner wall surface of the through hole is dissolved during the evaporation of the liquid so that the conductive layer is protruded from the inner wall of the through hole penetrating the conductive layer, by which connection between the through hole conductor and the conductive layer is reliably accomplished. Incidentally, in order to protrude the conductive layer at the inner wall of the through hole, the liquid to be contained in the base member may be selected appropriately according to the first organic binder included in the green sheet.

Furthermore, according to a method of processing a composite green sheet of the present invention, the solubility of the second organic binder in the liquid at 25° C. is preferably determined to be lower than the solubility of the first organic binder in the liquid at 25° C. This makes the green sheet to be more soluble in the liquid than the conductive layer and facilitates protrusion of the conductive layer at the inner wall of the through hole, so that connection between the through hole conductor and the conductive layer can be accomplished reliably.

Also, according to a method of processing a composite green sheet of the present invention, the solubility of the first organic binder in the liquid at 25° C. is preferably determined to be 0.1-10%. When the solubility of the first organic binder in the liquid at 25° C. is lower than 0.1%, the foregoing effect of dissolving the first organic binder is small, and when the solubility exceeds 10%, the composite green sheet at the through hole dissolves excessively, increasing the possibility to unduly expand the through hole. If conductive layers that are not required to be exposed at the inner wall surface of the through hole are exposed, unwanted short-circuit may occur.

Also, according to a method of processing a composite green sheet of the present invention, the solubility of the second organic binder in the liquid at 25° C. is preferably determined to be 1% or less excluding 0%. When the solubility of the second organic binder in the liquid at 25° C. exceeds 1%, the conductive layer to be exposed at inner wall surface of the through hole is dissolved excessively, making the connection between the through hole conductor and conductive layer unstable.

Moreover, since the base member comprises a porous or fibrous material, a great amount of liquid can be impregnated in the base member, so that vapor of high temperature and high pressure is generated not only from the base member immediately under the through hole irradiated with the laser light, but also from peripheral regions to which heat of the laser light propagates, so that the effect of removing waste is enhanced.

These and other advantages, features and effects of the present invention will be made apparent by the following description of preferred embodiments with reference to the accompanying drawings.

BRIEF DESCRIPTION OF THE DRAWINGS

FIG. 6 is a cross-sectional view of another composite green sheet (multilayer body) comprising a plurality of layers of the conductor layer and green sheet laminated together according to the present invention after completion of the processing.

FIG. 7 is a cross-sectional view of a process of a conventional method of processing a green sheet.

FIGS. 8(a)-8(b) are cross-sectional views of processes of a conventional method of processing a green sheet.

DETAILED DESCRIPTION OF PREFERRED EMBODIMENTS

Figure 1A:
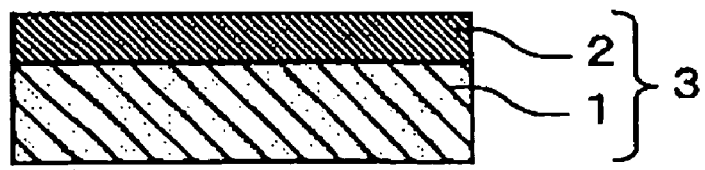
FIGS. 1(a)-1(d) are cross-sectional views of main processes of a method of processing a composite green sheet according to the present invention.
Figure 1B:
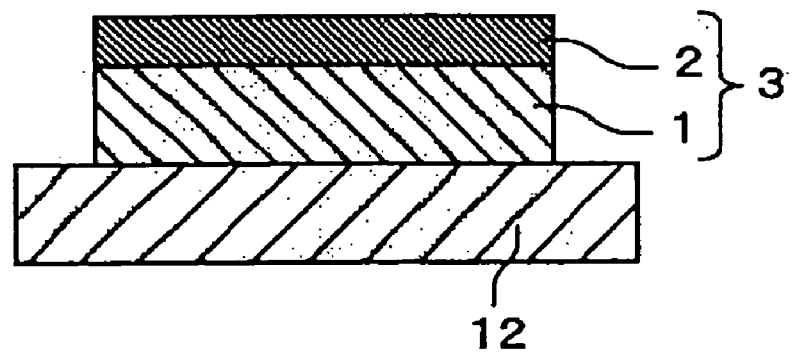
Figure 1C:
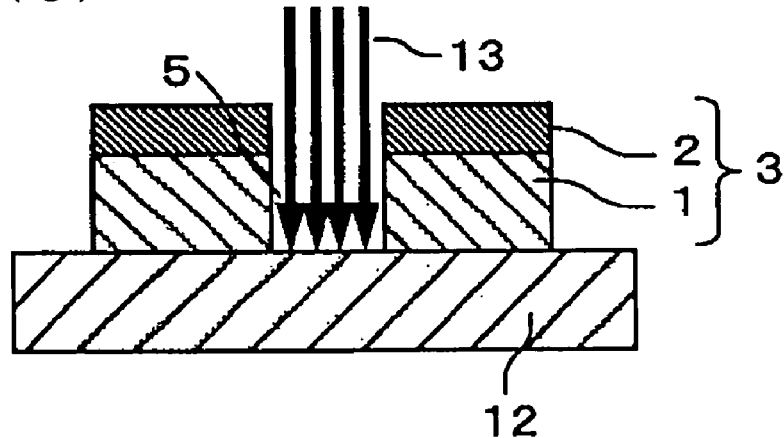
Figure 1D:
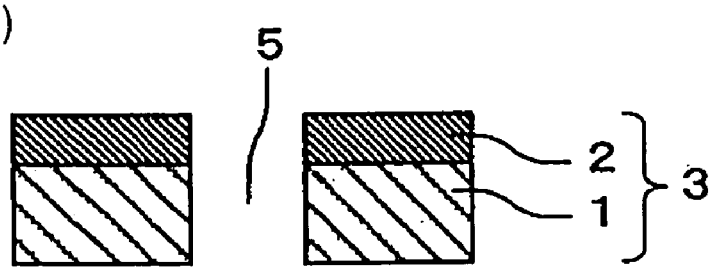

FIG. 1(d) shows one embodiment of a composite green sheet processed by a series of processes in a method according to the present invention.

A green sheet 1 is provided with a conductor layer 2 formed thereon to make up a composite green sheet 3, and a through hole 5 is further formed therein. The green sheet 1 includes an inorganic powder and an organic binder and the thickness thereof is determined to be 1-200 µm. For the inorganic powder, for example, a dielectric material with high dielectric constant composed mainly of $BaTiO_3$, $CaTiO_3$, $SrTiO_3$ or the like is used. For the organic binder, namely, polyvinyl acetals such as polyvinyl butyral, polyvinyl alcohols, polyacrylates, polymetacrylates, polymethacrylate and the like may be used. Using polyvinyl acetal is preferable, because organic binders including polyvinyl acetal exhibit high toughness, by which the green sheet is strengthened and machining accuracy is improved. Polyacrylate and polymethacrylate are also preferable for the organic binder, because when they are included, thermal decomposition of the organic binder occurs at low temperatures, making separation between dielectric layers hard to occur.

The conductive layer 2 includes conductive particles and a second organic binder, and the thickness thereof is determined to be 0.5-30 µm. Materials used for the conductive particles include, for example, materials mainly composed of metal such as Ni, Cu, Ag, Cu—Ni, Ag—Pd and the like. Materials used for the second organic binder include cellulose ethers such as ethyl cellulose, polyvinyl acetals such as polyvinyl butyral, polyvinyl alcohols, polyacrylates, polymetacrylates and the like. When the conductive layer 2 is formed by screen printing using conductive paste, cellulose ether is preferably used, because it allows the conductive paste to have high thixotropy, leading to good printability. Polyacrylate and polymethacrylate are also preferable for the organic binder, because when they are included, thermal decomposition of the organic binder occurs at low temperatures, making separation between dielectric layers hard to occur.

Subsequently, the through hole 5 of the composite green sheet 3 is processed, for example, such that it is filled with or the inner wall thereof is applied with conductive paste or the like. Thereafter, a plurality of the composite green sheets 3 are laminated together to be used for production of multilayer electronic components.

Now, as a first embodiment of the present invention, a method of processing a composite green sheet is described.

FIGS. 1(a)-1(b) are cross-sectional views showing a method of processing a composite green sheet according to a first embodiment of the present invention. In the method of processing a composite green sheet 1 according to the present invention, a through hole 5 is formed through the following processes A-D.

(Process A) A powder of a dielectric material composed mainly of $BaTiO_3$, $CaTiO_3$, $SrTiO_3$ or the like is mixed with an appropriate solvent such as butyl carbitol acetate or the like, a glass powder, and a first organic binder such as polyvinyl butyral or the like to produce a slurry. The obtained slurry is formed into a green sheet 1 serving as dielectric layer with a predetermined shape and predetermined dimensions by a publicly known method such as the doctor-blade method or the like.

Ni is used as the conductive particles, to which an appropriate solvent such as α-terpinol or the like, and ethyl cellulose or the like as a second organic binder are added to produce conductive paste. The conductive paste is applied to the green sheet 1 by a publicly known method such as screen printing, then it is dried to form a conductive layer 2, so that a composite green sheet 3 is obtained.

(Process B) As shown in FIG. 1(b), one surface side of the composite green sheet 3 is disposed on the supporting surface of the base member 12 containing a liquid.

(Process C) As shown in FIG. 1(c), a predetermined region of the composite green sheet 3 is irradiated with a laser light 13 from the other surface side of the composite green sheet 3 to form a through hole 5, and thereby to cause the laser light 13 to reach the supporting surface of the base member 12. As a result, a great amount of vapor evaporates from the liquid included in the base member 12, which allows waste adhering to the inner wall surface and edges of the through hole 5 to be removed, thereby allowing the conductive layer 2 to be exposed at the inner wall of the through hole 5 penetrating the conductive layer 2. This allows connection between the conductive layer 2 and a through hole conductor 4 formed later to be reliably accomplished. When, instead of the liquid contained in the base member 12, for example, a solid or a macromolecular material in a solid state is used, the volume of the material that evaporates from the solid is small. That is, although a macromolecular material in a solid state is decomposed by the laser light 13, since it is not necessarily decomposed into individual molecules such as monomers, $Co_2$, $H_2O$, $No_2$ and the like included in the macromolecular material, the volume of evaporation is small. In addition, there are cases where a solid or macromolecular material in a solid state, or solid materials denatured from them that are decomposed insufficiently adhere to the inner wall surface of the through hole 5. By using the base member 12 containing a liquid as in the present invention, a great amount of component thereof can be evaporated from the liquid with a minimum energy consumption. Incidentally, materials used for the liquid maybe, for example, water, phthalate esters including dibutyl phthalate, adipate esters, hydro chloro fluoro carbon (HCFC) and the like. When water is employed as the liquid, accidents such as ignition due to thermal energy of the laser light do not occur unlike the case of organic materials. For this reason, the processing conditions need not to be restricted for prevention of ignition, the range of choice of processing conditions is therefore extended. Accordingly, the energy of laser light can be increased so that evaporating moisture (water vapor) comes in contact with the inner wall surface of the through hole 5 at a high speed and high pressure. Therefore, the effect to blow off waste is enhanced and cleaning effect is improved.

Meanwhile, the liquid is not limited to water but may be a low-molecular-weight liquid having a molecular weight on the order of 400 or less. A sufficient amount of vapor can be generated when a liquid having a molecular weight on the order of 400 or less is used. As the liquids having molecular weights of 400 or less, dibutyl phthalate, dioctyl phthalate, dioctyl adipate, HCFC-123, HCFC-124 and the like may be recited. Since these materials in a liquid state have low risk of ignition when irradiated with laser light, no particular ignition prevention is needed. Using a liquid having a molecular weight on the order of 100 or less is more preferable because in such a case, the volume after evaporation is increased and the cleaning effect is improved. As liquids having molecular weights on the order of 100 or less, HCFC-22, water and the like may be recited.

In addition, when the liquid content in the base member 12 relative to the total weight of the base member 12 is 20 wt % or more, the amount of evaporation of the liquid is increased, enhancing the cleaning effect. More preferably, liquid content in the base member 12 is 50 wt % or more.

The green sheet 1 preferably includes a first organic binder that is soluble in the liquid. When the gas of high temperature and high pressure generated by evaporation of the liquid is collided with the waste, it is condensed to return to the liquid, which dissolves the first binder included in the waste, by which the waste can be removed. By dissolving the first organic binder included in the green sheet as described above, the conductive layers 2 can be protruded from the inner walls of the through holes 5 penetrating the conductive layers 2 as shown in FIG. 6. This allows connection between through hole conductors (not shown) formed by filling or applying a conductor inside the through holes and the conductive layers 2 to be reliably accomplished.

Moreover, the conductive layer 2 preferably includes a second organic binder that is soluble in liquid. When the gas of high temperature and high pressure generated by evaporation of the liquid is collided with the waste, it is condensed to return to the liquid, which dissolves the second binder included in the waste, by which the waste can be removed.

In addition, the solubility of the second organic binder in the foregoing liquid at 25° C. is slightly lower than the solubility of the first organic binder in the liquid at 25° C., by which the green sheet 1 is more soluble in the liquid than the conductive layers 2. Accordingly, the conductive layers 2 can be protruded from the inner walls of the through holes 5 more reliably, further ensuring the connection between the through hole conductors 4 and conductive layers 2. For example, when water is used as the liquid, the solubility in water of the first organic binder is required to be higher than the solubility in water of the second organic binder.

Main binders are listed in descending order of solubility in water as follows: polyvinyl acetal, polyvinyl alcohol, polyacrylate, polymethacrylate, and ethyl cellulose. The binders may be selected from among these materials taking the solubility into consideration. Meanwhile, the solubility in liquid may be changed by substituting a functional group of the main chain or side chain of the binder. For example, by adding a polar group such as carboxyl group, hydroxyl group or the like, the solubility in water is increased, and by adding a nonpolar group such as alkyl group or the like, the solubility in water is decreased. By utilizing this, for example, the solubility in water of polyacrylate can be differed between the same kinds by substituting a functional group in the main chain. Also, by an adjustment such as increasing the amount of a functional group in the main chain to be substituted, the foregoing order of solubility in water of the above-listed binders can be changed. For example, by adding an acryl group to a polyacrylate and a carboxyl group to another polyacrylate, polyacrylate and polymethacrylate that has a higher solubility in water than that of the former can be obtained. Adjustments of solubility by selection of the binder and partial modification of the binder as described above may also be carried out when using liquids other than water.

The solubility in the liquid of the first organic binder in the green sheet 1 at 25° C. is preferably 0.1% or more. This allows the liquid not only to evaporate to physically blow off waste, but also to easily dissolve waste created by denaturation of the green sheet 1 and the portions of the green sheet 1 to which waste adheres, so that the effect of removing waste is further enhanced.

In addition, the solubility in the liquid of the organic binder in the green sheet 1 at 25° C. is preferably 10% or less. When the solubility of the organic binder at 25° C. exceeds 10%, the solubility is great at regions in the vicinity of the base member 12 of the inner walls of the through holes in the green sheets, while the solubility at regions opposite to the base member 12 is small, which causes irregularity in shape of the through holes 5. For this reason, the solubility in the liquid of the organic binder in the green sheet 1 at 25° C. is determined to be 10% or less so that through holes 5 are evenly formed. Incidentally, in order to further reduce irregularity in shape of the through holes 5, the solubility in the liquid of the first organic binder at 25° C. is preferably 2% or less.

When the green sheet 1 includes the first organic binder soluble in the liquid as described above, enlarging the diameter of the through hole 5 is possible by the dissolution of the first organic binder in the liquid. The diameter can be enlarged by from about 2 μm to about 100 μm. Accordingly, through holes that have been preliminarily bored to have diameters of 50 μm to 500 μm can be enlarged to 52 μm to 600 μm. However, when the output of the laser light is too great, conductive particles in the conductive layers 2 are fused, by which the conductive layers 2 are recessed toward the interior of the green sheet 1 from the inner walls of the through holes 5.

Furthermore, by determining the solubility of the foregoing second organic binder in the liquid at 25° C. to be 0-1%, the conductive layers 2 are no longer dissolved in the liquid, enabling the conductive layers 2 to be protruded from at the through holes 5. This allows connection between the through hole conductors 4 that are applied to or injected into the through holes and the conductive layers 2 to be reliably accomplished. However, when the solubility of the second organic binder in the liquid at 25° C. exceeds 1%, conductive layers 2 around the through holes 5 are fused to be recessed toward the interior of the green sheet 1 from the inner walls of the through holes 5.

Combinations of the first organic binder, the second organic binder and the liquid may include the following: polyvinyl acetal, polyvinyl alcohol, polyacrylate, polymethacrylate or the like as the first organic binder, cellulose ether, polyacrylate, polymethacrylate or the like as the second organic binder, and water as the liquid. Other combinations may include the following: polyvinyl acetal, polyvinyl alcohol, polyacrylate, polymethacrylate or the like as the first organic binder, cellulose ether as the second organic binder, and phthalate ester, adipate ester or the like as the liquid. Incidentally, the solubility of cellulose ether in the liquid can be adjusted by selecting the kind and degree of substitution of the ether substituting for hydroxyl group of cellulose. For example, when water is used as the liquid, ethylcellulose in which the degree of substitution of ethoxyl group is 40-55 mol % is preferably used. As the method for evaluating the solubility of an organic binder associated with evaporation of liquid, solubility of the organic binder in a boiling liquid may be measured. The solubility in a boiling liquid of the organic binder in the green sheet 1 is preferably 20% or more for improved solubility. In addition, it is preferably 100% or less in order to reduce unevenness in shape between regions of the through holes 5 on the side of the base member and regions thereof on the opposite side.

As the base member 12, for example, a porous base material such as porous PET, porous PEN or the like impregnated with a liquid, or a fibrous base material such as paper impregnated with a liquid is used. Here, by forming the base member 12 using porous or fibrous base material, the liquid evaporates not only from regions of the base member 12 immediately under the through holes 5 irradiated with laser light 13, but also from peripheral regions to which heat of the laser light propagates, generating a further increased amount of vapor, which enhances the effect of removing waste. Incidentally, by supplying the liquid from the surface of the base member 12 that is opposite to the surface on which the composite green sheet 3 is disposed while the liquid is evaporated by irradiation with laser light, even when a plurality of through holes 5 that are arranged to be adjacent to each other in the composite green sheet are processed one by one, waste can be stably removed from all the adjacent through holes 5.

Also, when the base member 12 has a film-like form, transferring the base member 12 simultaneously with the composite green sheet 3 in the processing apparatus, and feeding the base member 12 by means of a roller or the like for replacing of a base member 12 used for the processing with an unused base member 12 are facilitated.

(Process D) The composite green sheet 3 is detached from the supporting surface of the base member 12 after the through hole 5 and the inner wall of the through hole 5 are cleaned in the above described manner.

Now, a method of processing a composite green sheet according to a second embodiment of the present invention is described based on the first embodiment. Note that the explanation of the same parts as those in the case of the first embodiment will not be repeated herein.

Figure 3A:
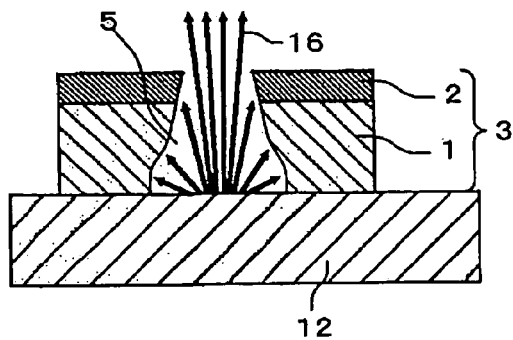
FIG. 3(a) is a cross-sectional view of a method of processing a green sheet in a condition where there is irregularity in shape of a through hole in the green sheet.
Figure 3B:
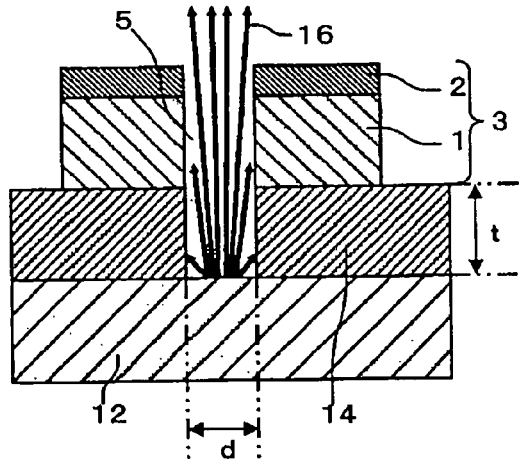
FIG. 3(b) is a cross-sectional view of a main process another method of processing a green sheet.

FIG. 3(b) is a cross-sectional view in a main process of the method of processing a composite green sheet according to the second embodiment of the present invention. Specifically, this embodiment differs from the first embodiment in that a separation film 14 is interposed between the composite green sheet 3 and the base member 12.

In the method of processing a composite green sheet 3 according to the second embodiment of the present invention, a through hole 5 is formed through the following Process A to Process D.

First, in Process A, a composite green sheet 3 is adhered to a separation film 14. The material for the separation film 14 is preferably sparingly soluble in the liquid contained in the base member 12, namely, PET or PEN when the liquid is water. Incidentally, the composite green sheet 3 may be adhered to the separation film 14 by applying slurry onto the separation film 14 to form a green sheet 1 on the separation film 14, and then forming a conductive layer 2 on the green sheet.

Subsequently, in Process B, the composite green sheet 3 and the separation film 14 are disposed on the supporting surface of the base member 12 with the side of the separation film 14 facing thereto. The content of the liquid contained in the base member 12 is preferably 20 wt % or more relative to the total weight of the base member 12 as in the case of the first embodiment described above.

Then, in Process C, a predetermined area of the composite green sheet 3 is irradiated with a laser light 13 so that a through hole 5 is formed in the composite green sheet 3 and the separation film 14, and the laser light 13 reaches the supporting surface of the base member 12, which allows a great amount of the liquid to be instantaneously evaporated to remove waste adhering to the inner wall and edges of the through hole 5. The paths 16 of the liquid during the evaporation are schematically shown in FIG. 3(b) by arrows. In the case without the separation film 14, as shown in FIG. 3(a), because of differences in the amount of vapor collided with the inner wall of the through hole 5 in the composite green sheet 3 and the angle of collision with respect to the inner wall between regions of the composite green sheet 3 in the vicinity of the base member 12 and regions of the same that are distant from the base member 12 (the upper side of the composite green sheet in FIG. 3(a)), difference is prone to be generated in the amount of the composite green sheet 3 to be dissolved. As a result, the through hole 5 is not formed to be cylindrical but prone to have a distorted shape, in particular, the diameter of the through hole 5 tends to be overly expanded in the vicinity of the base member 12. In contrast, when the separation film 14 is interposed as shown in FIG. 3(b), the amount of vapor collided with the inner wall of the through hole 5 and the angle of collision are uniformized all over the regions of the composite green sheet 3 in the vicinity of the base member 12 and regions of the same distant from the base member 12, so that the through hole 5 of the composite green sheet 3 can be formed into the desired shape, for example, a cylindrical shape with minimal distortion.

Furthermore, it is more preferable that the relationship between thickness t of the separation film 14 and diameter d of the through hole 5 satisfies $t \geq d$, because in such a case, evaporated liquid that passes through the separation film 14 and reaches the through hole 5 in the green sheet 1 passes in generally parallel to the inner wall of the through hole 5 in the composite green sheet 3, by which irregularlity in shape of the through hole 5 can be reduced.

Now, a method of processing a composite green sheet according to a third embodiment of the present invention is described. Note that the explanation of the same parts as those in the previously described embodiments will not be repeated herein.

FIGS. 2(a)-2(e) are cross-sectional views illustrating main processes of a method of processing a composite green sheet according to a third embodiment of the present invention. The method of processing a composite green sheet according to this embodiment includes the following Process E to Process I.

Figure 2A:
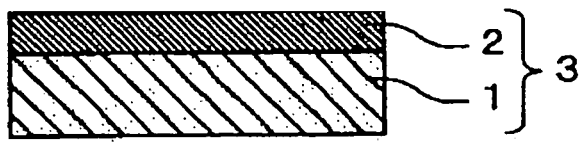
FIGS. 2(a)-2(e) are cross-sectional views of main processes of another method of processing a composite green sheet according to the present invention.

(Process E) First, as shown in FIG. 2(a), a green sheet 1 with predetermined shape and size and a conductive layer 2 are formed to constitute a composite green 1.

Figure 2B:
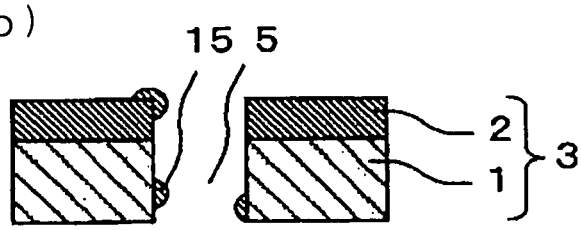

(Process F) Subsequently, as shown in FIG. 2(b), a through hole 5 is formed at a predetermined position before the composite green sheet 3 is placed on a base member 12. The processes for boring the through hole 5 include, namely, laser irradiation, microdrilling, punching with use of metal dies, and the like. However, in the case of laser irradiation, the organic binder, inorganic powder in the composite green sheet 3, and substances thereof that are denatured by the laser irradiation remain as waste 15 on the surface of the inner wall of the through hole 5. Also, in the cases of microdrilling and punching with use of metal dies, chippings of the composite green sheet 3 and crumbled portions of the inner wall surface remain as waste 15. In any case, waste 15 remains on the inner wall surface at this stage.

Figure 2C:
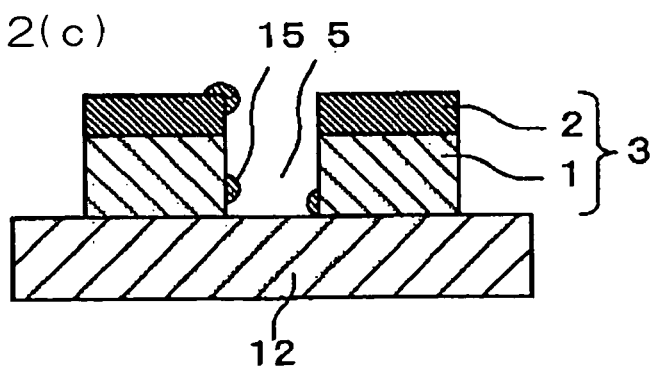

(Process G) The composite green sheet 3 in which the through hole 5 has been formed in Process F is placed on the supporting surface of the base member 12 containing a liquid as shown in FIG. 2(c). The liquid content is preferably 20 wt % or more.

Figure 2D:
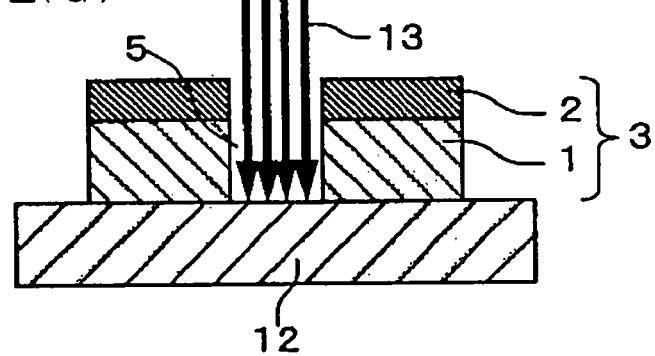
Figure 2E:
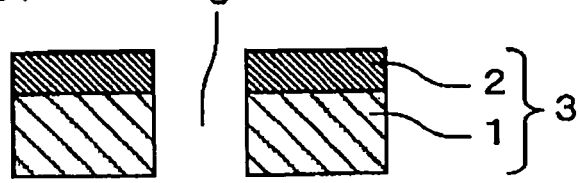

(Process H) As shown in FIG. 2(d), an area of the base member 12 that is exposed to the through hole 5 is irradiated with laser light 13 so as to evaporate a great amount of the liquid in the base member 12 instantaneously. During this process, vapor of high temperature and high pressure is generated, by which the waste 15 adhering to the inner wall surface and edges of the through hole 5 can be removed. By preliminarily forming the through hole 5 in the composite green sheet 3, the energy of laser light is not consumed for the formation of the through hole 5, but a constant amount of energy of laser light is allowed to irradiate the base member 12, so that unevenness in shape of the through hole 5 is prevented.

(Process I) The composite green sheet 3 is detached from the supporting surface of the base member 12.

Through the foregoing processes, the through hole 5 without having waste on the inner wall surface thereof can be formed in the composite green sheet 3.

Also in this method, a separation film 14 may be interposed between the composite green sheet 3 with the through hole preliminarily formed therein and the base member 12 as described above. In this case, it is preferable that after the composite green sheet is formed in the foregoing Process E, a separation film 14 is adhered to the composite green sheet, and a through hole is formed also in the separation film 14 as in the composite green sheet in the subsequent Process F. As a result, when the base member 12 is irradiated with laser light in Process H, the energy of laser light is not consumed for the formation of the through hole 5, but a constant amount of energy of laser light is allowed to irradiate the base member 12, so that irregularity in shape of the through hole 5 is precluded.

In addition, interposing the separation film 14 contributes to reducing irregularity in shape of the through hole 5 in the composite green sheet 3.

After Process I, the separation film 14 is detached from the composite green sheet 3.

A method of processing a composite green sheet according to a fourth embodiment of the present invention will be hereinafter described based upon the third embodiment. However, explanation of the same parts as those in the previous embodiments will not be repeated herein.

Figure 4:
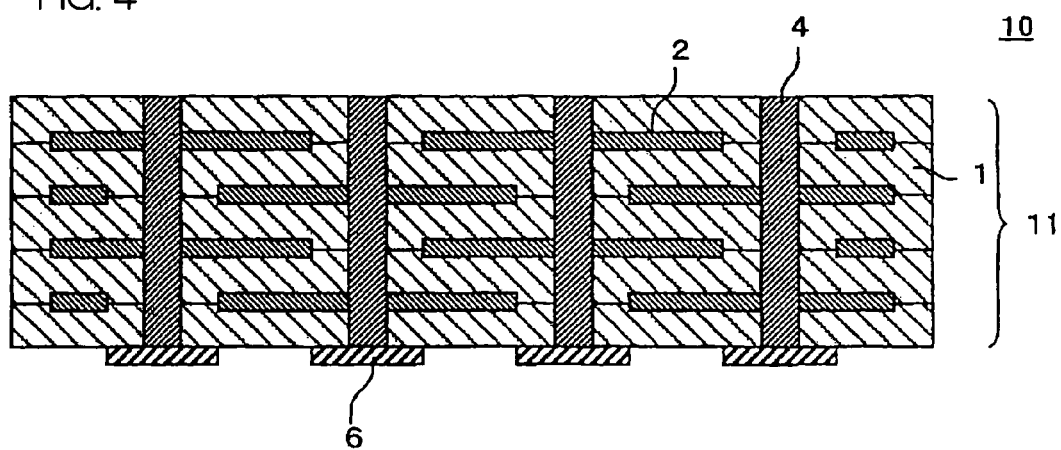
FIG. 4 is a cross-sectional view of a multilayer electronic component according to the present invention.

FIG. 4 is a cross-sectional view of a multilayer electronic component 10 produced according to the fourth embodiment of the present invention.

The multilayer electronic component 10 shown in FIG. 4 is constituted mainly of a multilayer body 11 and external electrodes 6. The multilayer body 11 is produced by firing a block including a plurality of layers of green sheet 1 and conductive layer 2 laminated together and through hole conductors 4 are formed so as to penetrate at least a part of the conductive layers 2. The number of the laminated layers of green sheet 1 is, for example, 3-2000. The diameter of the through hole conductors 4 is determined to be, for example, 30-300 μm. The conductive layers 2 are connected to the through hole conductors 4 at regions where the through hole conductors 4 penetrate the conductive layers 2. Incidentally, while a type in which the through hole conductors 4 fill the through holes 5 without clearances is shown in FIG. 4, it may be of another type in which the through hole conductors 4 are applied to the inner walls of the through holes 5 so as to be formed as hollow type conductors with vacant central portions.

The material for the through hole conductors 4 may be a conductive material composed mainly of metal such as Ni, Cu, Ag, Cu—Ni, Ag—Pd, or the like. A part of the external electrodes 6 is connected to the through hole conductors 4 that are exposed from the multilayer body. The material for the external electrodes may be, for example, Ni, Cu, Au or Sn. The external electrodes 6 are formed by printing and firing or plating, or by printing and firing followed by plating or the like.

Figure 5A:
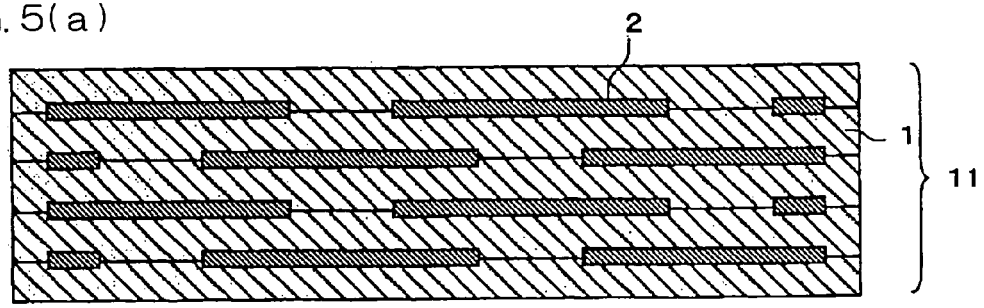
FIGS. 5(a)-5(c) are cross sectional views of main processes of a method of processing a composite green sheet (multilayer body) comprising a plurality of layers of the conductor layer and green sheet laminated together according to the present invention.
Figure 5B:
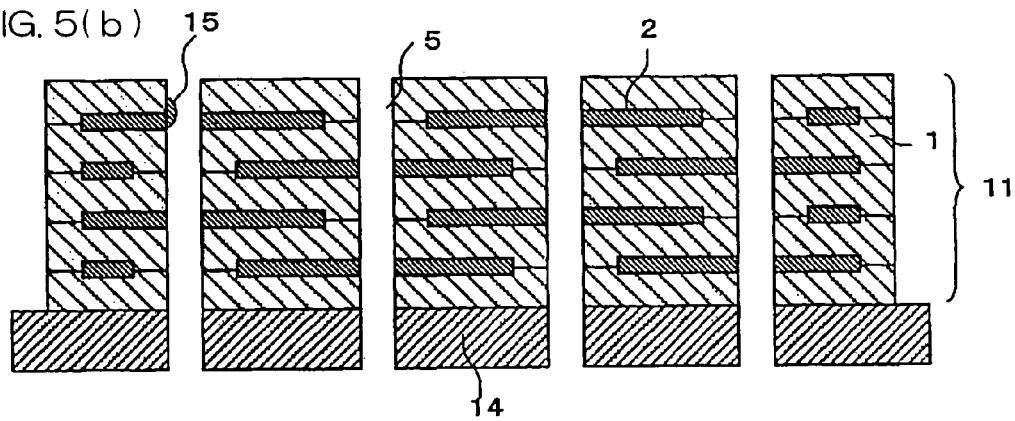
Figure 5C:
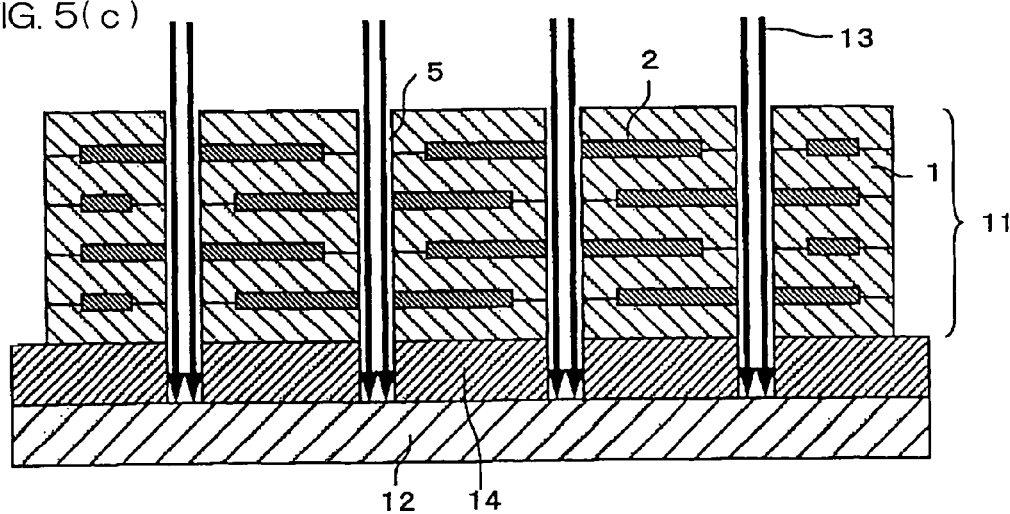

FIGS. 5(a) to 5(c) are cross-sectional views illustrating main processes of a method of processing a composite green sheet according to the fourth embodiment of the present invention. In the method of processing a composite green sheet 1, through holes 5 are formed through Process E to Process I. The following description will be mainly directed to the features that are different from the third embodiment.

(Process E) First, as shown in FIG. 5(*a*), a plurality of layers each comprising a green sheet 1 and a conductive layer 2 formed thereon are laminated together to prepare a multilayer body 11.

(Process F) After the multilayer body 11 is placed on a separation film 14, through holes 5 are formed in predetermined regions of the multilayer body 11 so as to penetrate the multilayer body 11 and the separation film 14. As the processes used for boring the though holes 5, laser irradiation, microdrilling, punching with use of metal dies and the like maybe recited. At this stage, chipping resulting from the processing remain as waste 15. In particular, when the size of the multilayer body 11 is 500 μm or greater, a black product that is regarded as denatured first organic binder adheres to the through holes 5 during the laser irradiation, which hinders the conductive layers 2 from being exposed at the inner walls of the through holes 5. Although thorough understanding of the cause of this has not yet been achieved, it is suspected that as the multilayer body 11 becomes thicker and the through holes 5 become longer, supply of oxygen inside the through holes 5 becomes inadequate, so that evaporation of the first organic binder is hindered, by which the black product is produced.

(Process G) The composite green sheet 3 is placed on the supporting surface of the base member 12 containing a liquid.

(Process H) As shown in FIG. 5(*c*), by irradiating areas of the base members 12 corresponding to the through holes 5 with laser light 13, a great amount of the cleaning agent that has been in a liquid state is evaporated and dispersed from the base member 12, and thereby the waste adhering to the inner walls and edges of the through holes 5 can be removed. During this process, the foregoing black product can also be removed additionally to the normal waste 15.

(Process I) The multilayer body 11 is detached from the supporting surface of the base member 12.

It should be understood that the present invention is not limited to the foregoing embodiments, but various modifications and improvements may be made without departing from the spirit and scope of the present invention.

For example, while in the drawings, the base member is shown in a condition where through holes are not formed in the areas thereof irradiated with laser light, the base member after the processing may have through holes formed in the areas irradiated with laser light.

In addition, while in the drawings, the composite green sheet 3 is placed on the base member 12 with the side having the green sheet 1 facing the surface of the base member 12, the side having the conductive layer 2 may be disposed on the base member 12. Also, a composite green sheet comprising a green sheet having conductive layers formed on the both sides thereof may be placed on the base member 12.

Furthermore, the laser used for the formation and cleaning of the through holes may be $Co_2$ laser, UV-YAG laser, excimer laser or the like.

Incidentally, liquid generated in the cleaning process occasionally adheres to the green sheet in small amount.

This may be dealt with natural drying by leaving as it is, absorption by the green sheet or forcible drying by heating or the like according to need.

Additionally, a light absorbent agent may be added to the base member or the liquid to enhance the utilization efficiency of the laser light for irradiation so that the processing time is shortened and the speed of the liquid evaporation is increased, thereby improving the cleaning efficiency.

The invention claimed is:

1. A method of processing a composite green sheet comprising:
    a process A of preparing a composite sheet including a conductive layer and a green sheet;
    a process B of placing a surface of the composite sheet on a base member containing a liquid; and
    a process C of irradiating another surface of the composite sheet with a laser light to form a through hole penetrating the composite sheet and to evaporate the liquid,
    wherein the green sheet includes a first organic binder that is soluble in the liquid.

2. The method of processing a composite green sheet according to claim 1, further including a process D of detaching the composite green sheet having the through hole formed therein from the base member.

3. The method of processing a composite green sheet according to claim 1, wherein the composite green sheet comprises a plurality of layers of the green sheet and the conductive layer laminated together.

4. A method of processing a composite green sheet comprising:
    a process A of preparing a composite sheet including a conductive layer and a green sheet;
    a process B of placing a surface of the composite sheet on a base member containing a liquid; and
    a process C of irradiating another surface of the composite sheet with a laser light to form a through hole penetrating the composite sheet and to evaporate the liquid,
    wherein the conductive layer comprises an organic binder that is soluble in the liquid.

5. The method of processing a composite green sheet according to claim 1,
    wherein the liquid comprises water.

6. A method of processing a composite green sheet comprising:
    a process A of preparing a composite sheet including a conductive layer and a green sheet;
    a process B of placing a surface of the composite sheet on a base member containing a liquid; and
    a process C of irradiating another surface of the composite sheet with a laser light to form a through hole penetrating the composite sheet and to evaporate the liquid,
    wherein the liquid comprises a low-molecular-weight organic material having a molecular weight on the order of 400 or less.

7. A method of processing a composite green sheet comprising:
    a process A of preparing a composite sheet including a conductive layer and a green sheet;
    a process B of placing a surface of the composite sheet on a base member containing a liquid; and
    a process C of irradiating another surface of the composite sheet with a laser light to form a through hole penetrating the composite sheet and to evaporate the liquid,
    wherein the liquid comprises at least one kind selected from the group consisting of phthalate esters including dibutyl phthalate, adipate esters, and hydro chloro fluoro carbon (HCFC).

8. The method of processing a composite green sheet according to claim 1, wherein the conductive layer includes a second organic binder that is soluble in the liquid, and the solubiity of the second organic binder in the liquid at 25° C. is lower than the solubility of the first organic binder in the liquid at 25° C.

9. The method of processing a composite green sheet according to claim 1, wherein the solubility of the first organic binder in the liquid at 25° C. is 0.1-10%.

10. The method of processing a composite green sheet according to claim 4, wherein the solubiity of the organic binder in the liquid at 25° C. is 1% or less excluding 0%.

11. The method of processing a composite green sheet according to claim 1,
wherein the base member comprises a porous or fibrous material and includes the liquid impregnated therein.

12. The method of processing a composite green sheet according to claim 1,
wherein the base member is a film.

13. The method of processing a composite green sheet according to claim 1,
wherein a separation film is interposed between the base member and the composite sheet, and the irradiated laser light reaches the base member through the separation film.

14. The method of processing a composite green sheet according to claim 13, wherein the separation film comprises a material that is sparingly soluble in the liquid.

15. A method of processing a composite green sheet comprising:
a process E of preparing a composite green sheet including a conductive layer and a green sheet;
a process F of forming a through hole in a predetermined region of the composite green sheet;
a process G of placing the composite green sheet on a base member containing a liquid; and
a process H of irradiating a region of the base member corresponding to the through hole with a laser light so as to evaporate the liquid,
wherein the green sheet includes a first organic binder that is soluble in the liquid.

16. The method of processing a composite green sheet according to claim 15, further comprising a process I of detaching the composite green sheet with the through hole having been cleaned from the base member.

17. The method of processing a composite green sheet according to claim 15, wherein the composite green sheet comprises a plurality of layers of the green sheet and the conductive layer laminated together.

18. A method of processing a composite green sheet comprising:
a process E of preparing a composite green sheet including a conductive layer and a green sheet;
a process F of forming a through hole in a predetermined region of the composite green sheet;
a process G of placing the composite green sheet on a base member containing a liquid; and
a process H of irradiating a region of the base member corresponding to the through hole with a laser light so as to evaporate the liquid,
wherein the conductive layer comprises an organic binder that is soluble in the liquid.

19. The method of processing a composite green sheet according to claim 15,
wherein the liquid comprises water.

20. A method of processing a composite green sheet comprising:
a process E of preparing a composite green sheet including a conductive layer and a green sheet;
a process F of forming a through hole in a predetermined region of the composite green sheet;
a process G of placing the composite green sheet on a base member containing a liquid; and
a process H of irradiating a region of the base member corresponding to the through hole with a laser light so as to evaporate the liquid,
wherein the liquid comprises a low-molecular-weight organic material having a molecular weight on the order of 400 or less.

21. A method of processing a composite green sheet comprising:
a process E of preparing a composite green sheet including a conductive layer and a green sheet;
a process F of forming a through hole in a predetermined region of the composite green sheet;
a process G of placing the composite green sheet on a base member containing a liquid; and
a process H of irradiating a region of the base member corresponding to the through hole with a laser light so as to evaporate the liquid,
wherein the liquid comprises at least one kind selected from the group consisting of phthalate esters including dibutyl phthalate, adipate esters, and hydro chloro fluoro carbon (HCFC).

22. The method of processing a composite green sheet according to claim 15, wherein the conductive layer includes conductive particles and a second organic binder that is soluble in the liquid, and the solubility of the second organic binder in the liquid at 25° C. is lower than the solubility of the first organic binder in the liquid at 25° C.

23. The method of processing a composite green sheet according to claim 15, wherein the solubility of the first organic binder in the liquid at 25° C. is 0.1-10%.

24. The method of processing a composite green sheet according to claim 18, wherein the conductive layer includes conductive particles and a second organic binder that is soluble in the liquid, and the solubility of the second organic binder in the liquid at 25° C. is 1% or less excluding 0%.

25. The method of processing a composite green sheet according to claim 15,
wherein the base member comprises a porous or fibrous material and includes the liquid impregnated therein.

26. The method of processing a composite green sheet according to claim 15,
wherein the base member is a film.

27. The method of processing a composite green sheet according to claim 15,
wherein a separation film is interposed between the base member and the green sheet, and the irradiated laser light reaches the base member through the separation film.

28. The method of processing a composite green sheet according to claim 27, wherein the separation film comprises a material that is sparingly soluble in the liquid.

* * * * *